United States Patent
Wos et al.

(10) Patent No.: US 6,872,912 B1
(45) Date of Patent: Mar. 29, 2005

(54) WELDING SINGLE CRYSTAL ARTICLES

(75) Inventors: Frank Wos, Landing, NJ (US); Zengmei Wang Koenigsmann, Congers, NY (US)

(73) Assignee: Chromalloy Gas Turbine Corporation, Orangeburg, NY (US)

(*) Notice: Subject to any disclaimer, the term of this patent is extended or adjusted under 35 U.S.C. 154(b) by 0 days.

(21) Appl. No.: 10/889,207

(22) Filed: Jul. 12, 2004

(51) Int. Cl.[7] ............................................. B23K 26/20
(52) U.S. Cl. .................. 219/121.64; 148/524; 148/525; 228/231
(58) Field of Search ................. 219/121.64, 121.66; 148/524, 525, 527, 528; 228/231, 262.3; 117/1, 7

(56) References Cited

U.S. PATENT DOCUMENTS

| | | |
|---|---|---|
| 4,122,240 A | 10/1978 | Banas et al. |
| 4,249,963 A | 2/1981 | Young |
| 4,285,459 A | 8/1981 | Baladjanian et al. |
| 4,323,756 A | 4/1982 | Brown et al. |
| 4,359,352 A | 11/1982 | Ray et al. |
| 4,743,733 A | 5/1988 | Mehta et al. |
| 4,804,815 A | 2/1989 | Everett |
| 4,878,953 A | 11/1989 | Saltzman et al. |
| 5,038,014 A | 8/1991 | Pratt et al. |
| 5,106,010 A | 4/1992 | Stueber et al. |
| 5,232,789 A | 8/1993 | Platz et al. |
| 5,319,179 A | 6/1994 | Joecks et al. |
| 5,374,319 A | 12/1994 | Stueber et al. |
| 5,395,584 A | 3/1995 | Berger et al. |
| 5,554,837 A | 9/1996 | Goodwater et al. |
| 5,725,693 A | 3/1998 | Santella et al. |
| 5,783,318 A | 7/1998 | Biondo et al. |
| 5,897,801 A | 4/1999 | Smashey et al. |
| 5,898,994 A | 5/1999 | Miller et al. |
| 5,900,170 A | 5/1999 | Marcin et al. |
| 5,914,059 A | 6/1999 | Marcin et al. |
| 6,024,792 A | 2/2000 | Kurz et al. |
| 6,037,563 A | 3/2000 | Foster et al. |
| 6,054,672 A | 4/2000 | Foster et al. |
| 6,084,196 A | 7/2000 | Flowers et al. |
| 6,103,402 A | 8/2000 | Marcin et al. |
| 6,193,141 B1 * | 2/2001 | Burke et al. ................. 228/190 |
| 6,333,484 B1 * | 12/2001 | Foster et al. ........... 219/121.64 |
| 6,489,584 B1 | 12/2002 | Kelly |
| 6,495,793 B2 | 12/2002 | Tewari |
| 6,503,349 B2 * | 1/2003 | Pietruska et al. ........... 148/562 |
| 6,544,668 B1 | 4/2003 | Santella et al. |
| 6,673,169 B1 | 1/2004 | Peterson et al. |
| 2003/0213427 A1 | 11/2003 | Betz |

FOREIGN PATENT DOCUMENTS

| | | |
|---|---|---|
| EP | 0740977 A1 | 11/1996 |
| EP | 0861927 A1 | 9/1998 |

* cited by examiner

*Primary Examiner*—Geoffrey S. Evans
(74) *Attorney, Agent, or Firm*—Mitchell D. Bittman

(57) ABSTRACT

A process is provided for crack-free welding a nickel based single crystal superalloy article containing at least 5 weight % total of Al and Ti. The process comprises: melting an article surface to be welded and a filler alloy with an energy source, preferably a laser, wherein the filler alloy is a composition of a nickel based single crystal superalloy except that the total of Al and Ti is reduced below 5 wt %; allowing the melted article surface and filler alloy to solidify to form a bead of deposit; providing a plurality of beads of adjacent deposits covering the article surface to be welded; and remelting the adjacent beads of deposits with the energy source to provide vertically oriented crystal growth in the deposits.

20 Claims, 4 Drawing Sheets

Figure 1  0.25 mm

WELDING SINGLE CRYSTAL ARTICLES

BACKGROUND

The typical width of a weld for a directionally or single crystal article build-up is generally limited to the width of a single weld bead (see FIG. 1) which is generally up to 1.9 mm wide. However, many components often have surfaces which require a larger width build-up than a single weld bead. Using parallel and overlapped weld beads to enlarge the build-up width is common in laser powder welding repairs. However, due to the inhomogeneous solidification rate between the beads, a significant amount of micro-grains are created (see FIG. 2) which is generally unsuitable for directionally or single crystal articles, thus limiting the welding process to a single weld bead width.

Nickel based single crystal or directionally solidified (DS) superalloys (hereinafter jointly referred to as single crystal superalloys) with a high volume fraction of gamma prime precipitates are susceptible to strain age cracking resulted from welding. Therefore many weld repair processes are carried out using conventional solid solution strengthened welding alloys such as Inconel 625 or an oxidation resistant high strength Co based weld fillers. However, many weldable Ni fillers such as IN-625 due to its low Al and Ti are softer than most of the nickel based single crystal superalloys, which is not desirable for component tip or edge repairs that require considerable strength. Further, the large thermal expansion mismatch between the high strength Co or Ni fillers and the nickel superalloy substrate could produce high thermo-mechanically induced damage and low TMF (thermal mechanical fatigue) life during service. To extend the repaired component life, ideally, the weld metal used should have either the same or very similar composition as the base metal so that the thermal expansion and creep properties of the weld will closely match the base metal. This is particularly attractive for nickel based single crystal superalloy components. However, it is very difficult to produce a crack free weld with any nickel based single crystal alloy filler as the presence of high Al and Ti contents in the filler results in substantial shrinkage strains from gamma prime precipitation.

The prior art discloses two major approaches to eliminating the cracks in the nickel base superalloy weld build-up: 1) laser powder weld build-up while heating the component substrate (see U.S. Pat. No. 5,106,010, U.S. Pat. No. 6,037,563, EP 0861927 and U.S. Pat. No. 6,024,792); and 2) using low energy laser beams to re-heat each deposited layer (U.S. Pat. No. 5,900,170, U.S. Pat. No. 5,914,059 and U.S. Pat. No. 6,103,402). While heating the components during laser powder welding is effective, it is an expensive process, can cause distortion of the component and has the potential of affecting the microstructure of the single crystal alloy and for DS alloys there can be incipient melting at the grain boundaries.

SUMMARY

A process is provided for crack-free welding a nickel based single crystal superalloy article containing at least 5 weight % total of Al and Ti. The process comprises: melting an article surface to be welded and a filler alloy with an energy source, preferably a laser, wherein the filler alloy is a composition of a nickel based single crystal superalloy except that the total of Al and Ti is reduced below 5 wt %; allowing the melted article surface and filler alloy to solidify to form a bead of deposit; providing a plurality of beads of adjacent deposits covering the article surface to be welded; and remelting the adjacent beads of deposits with the energy source to provide vertically oriented crystal growth in the deposits.

DETAILED DESCRIPTION

Figure 1:
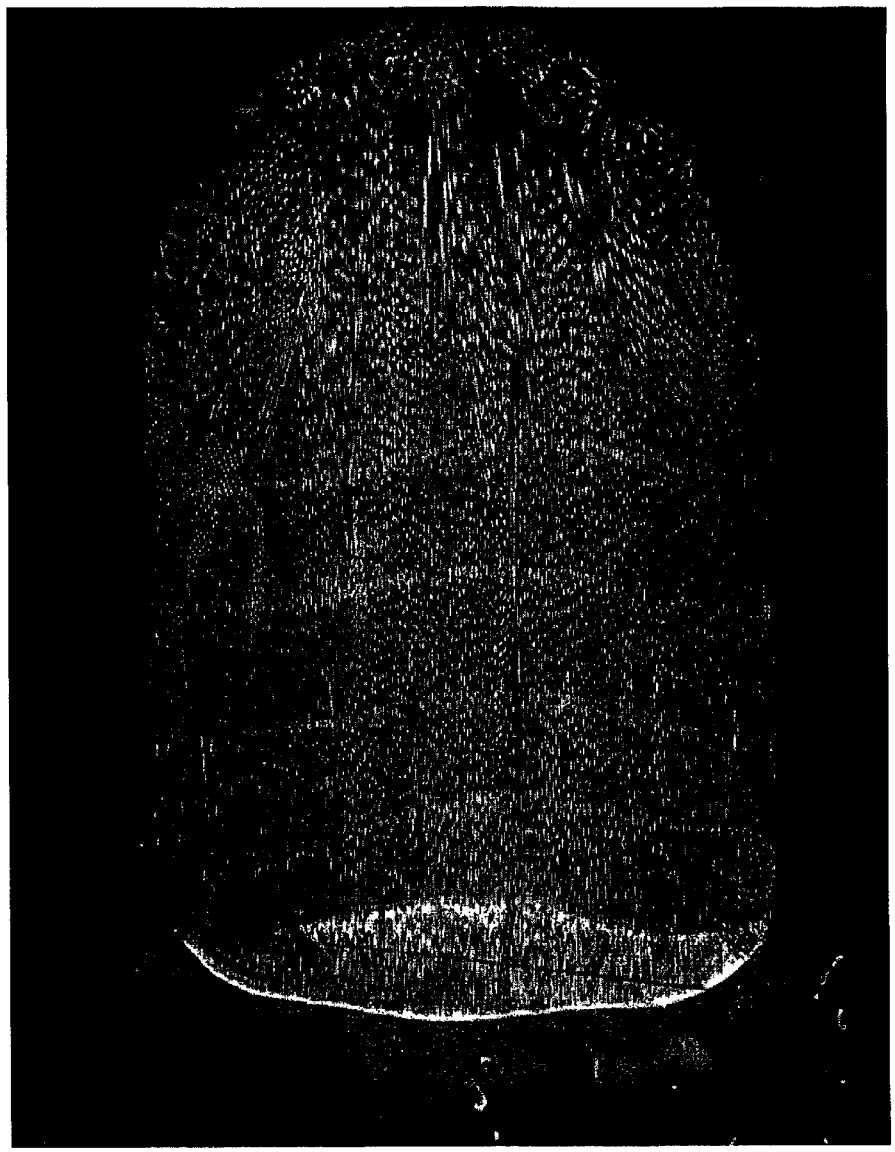
FIG. 1 is a photomicrograph (50× magnification) of a cross section of a laser powder single bead six layer build-up on a nickel based single crystal alloy.
Figure 2:
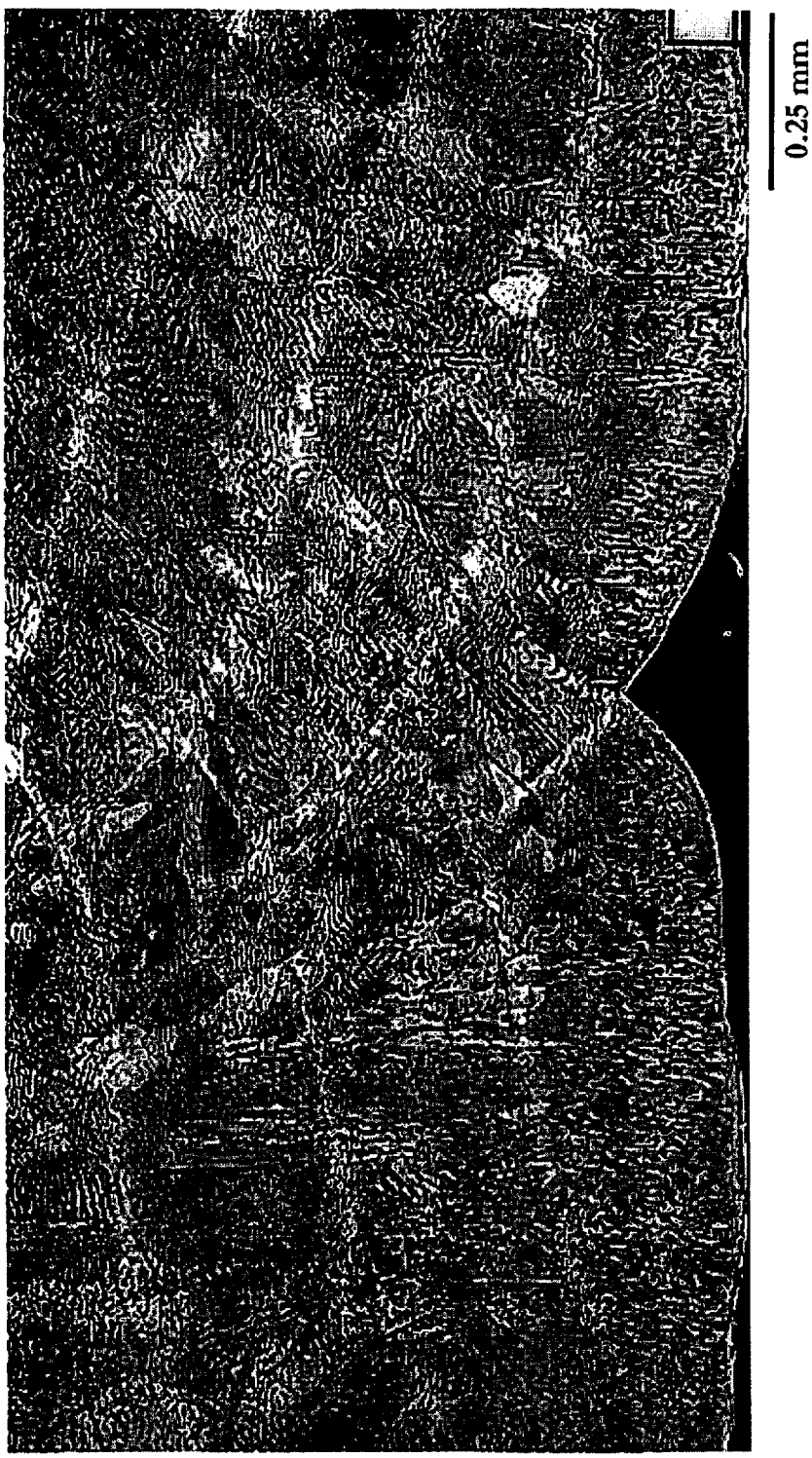
FIG. 2 is a photomicrograph (50× magnification) of a cross section of a laser powder welding deposit of multiple beads on a nickel based single crystal alloy to achieve a desired build-up and width.

A modified nickel based single crystal alloy composition with reduced Al and Ti contents is used as the filler alloy in the welding build-up process. The nickel based single crystal superalloy article contains at least 5 weight % total of Al and Ti. As used herein the term single crystal jointly refers to both single crystal and directionally solidified (DS) crystal alloys. Table 1 lists the composition of various single crystal, DS as well as common Ni weld filler alloys.

The filler alloy has the composition of a nickel based single crystal superalloy article except that the total of Al and Ti is reduced to below 5 weight %, preferably to about 1.5 to 4.5 weight %. Preferably the filler alloy has substantially the same composition as the nickel based superalloy article except for the reduced total of Al and Ti and is comprised of the same elements in approximately the same proportions as in the article. The reduction of total Al and Ti content allows the filler alloy to be weldable. By use of the filler alloy in this process, the addition of melting point depressants, such as boron or silicon, which can adversely affect the properties of the superalloy article and the welded surface can be avoided.

The process applies the filler alloy to the nickel based single crystal superalloy article for a weld build-up using a laser powder welding technique. By controlling energy output, welding speed, and powder deposition rate the solidification rate is controlled providing the desired directional solidification in the weld build-up. Preferably, the process is carried out in a protected inert gas shielded atmosphere and at ambient temperature. As the articles do not need to be heated while welding, the process is more easily carried out in production applications. When the component is heated during welding the process becomes more difficult (see U.S. Pat. No. 5,106,010, U.S. Pat. No. 6,037,563, EP 0861927 and U.S. Pat. No. 6,024,792) and the articles as well as the microstructure can be detrimentally effected. By avoiding heating of the articles the process is production friendly, saves time (avoids heat ramp-up, stabilization and cool down periods) and providing cost saving as a heating unit and heat control operations are not required.

The rapid solidification during the welding process results in a finer dendrite microstructure in the build-up than that in the substrate. Consequently, the build-up has a more uniform chemical distribution and a higher strength. This is especially beneficial for tip or edge repair.

To compensate for the lower Al content in the weld build-up, an aluminide coating can be applied and diffused into the weldment. This can be effective in restoring the same properties in the weldment as in the nickel based single crystal superalloy article. An aluminum coating can be applied by processes as know in the art including vapor phase deposition and pack cementation, followed by a heat treatment to diffuse the aluminum into the weldment. The increased aluminum content improves oxidation resistance and may increase gamma prime precipitation similar to that of the nickel based single crystal alloy article. The aluminum coating can be applied to a thickness of up to about 10 mils (0.25 mm), typically 4 to 8 mils (0.07 to 0.2 mm), followed by a heat treatment, typically at 1600° F. to 2100° F. (870° C. to 1150° C.), for one to twelve hours (e.g. 1975° F. (1080° C.) for four hours), to diffuse the aluminum into the weldment. As the aluminum coating provides oxidation protection and the aluminum content of the weldment may be increased by the aluminum coating, the combined Al and Ti in the filler alloy can be more readily reduced to about 1.5 to 3.0 weight % to facilitate welding.

The laser powder welding process melts the article surface and the filler alloy and allows the melted article surface and filler alloy to solidify forming a bead of deposit, with the bead having a defined build-up width and length on the substrate. A plurality of beads of adjacent deposits are formed covering the article surface to be welded. Then the beads of adjacent deposits are remelted to provide vertically oriented crystal growth in the deposits (see FIGS. 3 and 4). In one embodiment a laser remelting pass that is a de-focused laser beam scans over the entire length of each top deposited layer covering multiple adjacent beads (e.g. a 3 mm width). In this embodiment the remelting penetrates at least 50% of, preferably the entire, top layer (see FIG. 4). In another embodiment, the laser penetrates the interface areas of the adjacent beads with the remelting preferably penetrating at least 50% of the top layer deposited (see FIG. 3). In this embodiment the laser for the remelting pass can be at the same power density and focus as for the powder deposition. The laser power and travel speed in the laser remelting pass are chosen to establish suitable thermal gradient and cooling rate for the single crystal solidification and to integrate the multiple beads of adjacent deposits and align their crystal growth. By repeating the process, multiple single-crystal solidified layers can be built-up to obtain a required build-up height. The combination of depositing adjacent beads and remelting passes can produce a single crystal solidified build-up that has a larger width than a single bead build-up.

A $CO_2$ continuous wave laser (e.g. manufactured by Rofin-Sinar Corporation) with powder welding system operating in a TEM 01* mode with a coaxial powder delivery nozzle was employed in the process. The laser beam was slightly defocused to produce a low aspect ratio molten pool on the metal article surface. It is preferred that the laser melts a shallow pool of the substrate, with an aspect ratio of width/depth of at least 5. The initial laser pass delivers the filler alloy powder into the path of the slightly defocused laser beam and deposits the melted filler alloy on the surface. The molten alloy pool solidifies to form a defined size bead of deposit on the article surface. This process is repeated to provide a plurality of adjacent deposits covering the article surface to be welded. In one embodiment a laser remelting pass then scans over the whole length of each top deposited layer of the build-up with the laser beam in the remelting pass being highly defocused to cover multiple adjacent beads of the top layer surface. The adjacent beads of deposits are remelted and resolidified to form a single crystal alloy layer with a vertically oriented crystal growth that avoids the micro-grains created between the beads and essentially has a matched crystal orientation and lattice constant as the article or the adjacent layer beneath (see FIG. 4). In a second embodiment the interface area between the adjacent deposits are remelted and resolidified to form a vertically oriented crystal growth avoiding the micro-grains created between the beads (see FIG. 3).

Suitable parameters for carrying out the process includes a filler alloy powder deposition pass traveling at about 20 to 35 IPM (inches per minute, 50 to 90 cm/mm) with laser output power of about 700 to 1400 Watts, with a typical deposition process operated at about 25 IPM (65 cm/min) and about 1000 Watts. The energy density of the laser in the powder deposition pass is on the order of about $10^4$ to $10^5$ watts/cm$^2$ and the filler alloy powder flow is at a rate of about 2 to 8 g/min, with a typical process operated at $10^5$ watts/cm$^2$ and about 3 to 4 g/min. These parameters can be adjusted in accordance with the alloy powder type and powder particle size applied. The selection of the laser power and welding speed for the remelting pass is critical for establishing a suitable thermal gradient and solidification rate during the single crystal build-up. The remelting pass is operated at a speed of about 5 to 25 IPM (10 to 65 cm/min) and a laser power of about 600 to 1400 Watts, with a typical process operated at about 15 IPM (40 cm/min) and about 1000 Watts. The thermal gradient is established at an order of about $10^4$ K/cm and cooling rate is at about $10^3$ K/s. The laser beam used for remelting can have relatively high energy density, i.e. in an order of about $10^4$ to $10^5$ watts/cm$^2$, typically $10^5$ watts/cm$^2$, to insure remelting of the entire deposited layer. The travel direction in the remelting pass follows the direction of the bead deposit. By repeating the steps for the each layer, multiple single crystal layers can be obtained for a required build-up height. In the embodiment where for remelting the laser is defocused to cover multiple beads, typically it is defocused to cover about 2 to 6 mm, preferably about 2 to 3 mm, which can cover from 2 to 12 adjacent beads. In the embodiment where the interface between the beads is remelted the laser can be maintained at the same focus and spot size as that used for the powder deposition.

While a low laser beam energy during the remelting pass could be used to minimize the heat input and assist in a crack free build-up, with the use of the filler alloy a high energy beam input can be utilized to insure thorough remelting of the deposited layer and vertical crystal orientation throughout the weldment without cracking. In addition, the filler alloy powder in the bead deposit can be deposited in the opposite tool path directions on the alternate layers and the remelting also scans bi-directionally in order to reduce weld stresses. The rapid solidification during the welding process results in a much finer dendrite microstructure in the build-up than that in the substrate. Consequently, the build-up has a more homogeneous chemical distribution and a higher strength. This is especially beneficial for the component tip or edge repair.

Laser powder welding of turbine components is carried out in an automated operation which utilizes a five-axis CNC controlled powder-welding center. A single HPT blade or multiple blades can be loaded into root holding fixture/s which are situated on a pallet and the pallet with walls forming an open topped chamber allowing the components to be submerged in an argon bath to avoid oxidation during welding.

The blade tip surface is prepared for welding by heat treating in vacuum at 1975° F. (1080° C.) for 4 hours and the blade tip surface to be welded is mechanically blended and glass peened to remove any contaminants. The blades are then placed into a root holding fixture located within an open top chamber. A protective shield is placed around each blade airfoil and slightly below the tip to protect the blade from powder over spray onto the platform during the deposition process. The chamber is fed an argon gas at a rate of 40–60 CFH within which the parts are submerged. The process is carried out at ambient room temperature thus eliminating ramp up, stabilization, and quench times. The blade is moved into position for a vision system which digitizes the weld area of the blade tip to be powder weld repaired. The blade is then automatically positioned under a laser powder weld nozzle (see U.S. Pat. No. 5,477,026) and a weld program tool path is created (along with supplied parameters and feed rates) and transferred to the computer, which controls the part movement under the powder nozzle.

The welded surface of the component is coated with aluminum by a gas phase process to deposit 6.5 mil (0.17 cm) aluminum on the surface. The component is then heat treated at 1875° F. (1025° C.)±25° F. (±15° C.) for 4 to 8 hours and then at 1975° F. (1080° C.)±25° F. (±15° C.) for 4 hours to diffuse the aluminum into the weldment.

EXAMPLE 1

A PWA 1484 nickel based single crystal alloy is laser powder welded with a Continuous Wave $CO_2$ laser manufactured by Rofin-Sinar Corporation operating in a transverse TEM 01* mode with a varied powder delivery nozzle.

The filler alloy had the following composition: Al–1.67 wt %; Co–5.3 wt %; Cr–10.5 wt %; Ta–12.3 wt %; W–4.1 wt %; Ti<0.001 wt % and balance Ni, which corresponds to a PWA 1480 alloy except for the reduced total of Al and Ti. The deposition process was carried out with a deposition movement of 25 IPM (64 cm/min) and a laser power of 1000 Watts with the energy density of the density pass being about $10^5$ Watts/cm$^2$ with a filler alloy power flow rate of about 3.25 g/min. The powder flows coaxially with the continuous wave laser beam from the powder weld nozzle toward the alloy surface. The standoff between the alloy surface and powder nozzle is from 0.15 to 0.20 inches (0.38 to 0.51 cm) during the powder deposition and remelting process. The powder deposition layer consists of multiple side-by-side beads, each with a width of 0.03 to 0.04 inches (0.07 to 0.10 cm). Three adjacent beads are deposited to cover the surface.

After a complete welded layer is applied, a remelting process without powder and centered along the bead interfaces is applied in order to rectify the interface areas and create a continuous columnar structure. The remelting process is repeated at a speed of about 5 IPM (13 cm/min), at about 600 Watts with an energy density of about $10^5$ Watts/cm$^2$. The remelt process is at the same nozzle standoff of 0.15 to 0.20 inches (0.38 to 0.51 cm), but is offset to scan along the centers of the bead interface.

Figure 3:
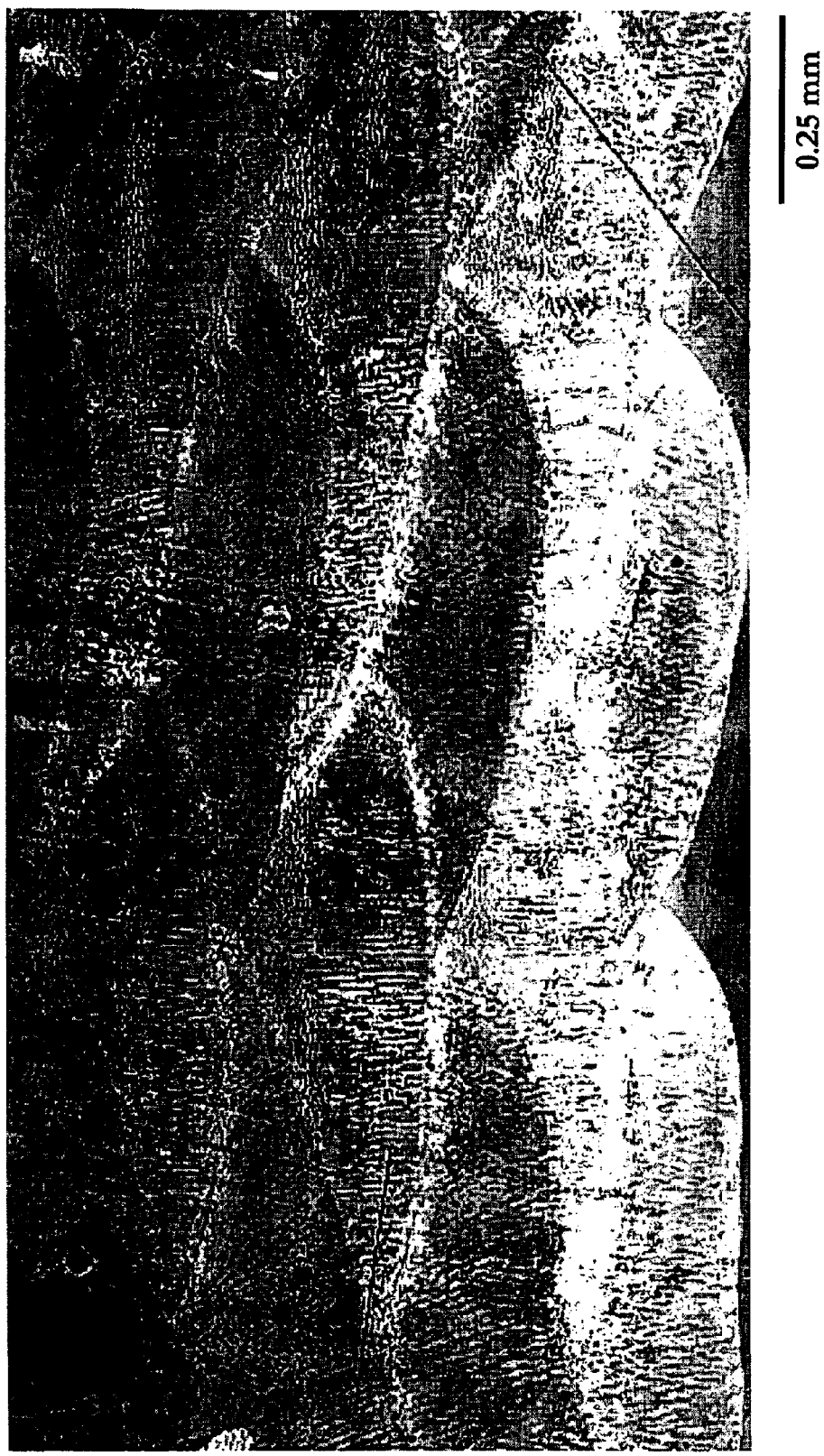
FIG. 3 is a photomicrograph (50× magnification) of a cross section of a laser powder welding deposit of multiple beads of filler alloy on a nickel based single crystal alloy with a laser remelt of the interface between the adjacent beads.

After a complete powder and remelt pass cycle a vertical move is made by the powder nozzle to compensate for the weld buildup and maintain the appropriate nozzle-to-tip standoff. Powder flow is then resumed and the next layer is applied with each combination powder deposition/remelting layer buildup being from 0.01 to 0.02 inches (0.25 to 0.5 mm) until the desired tip height is attained. The deposition and remelting steps were repeated 6 times providing a build-up height of 3 mm. The weldment had a crystal structure as shown in the photomicrograph of FIG. 3 wherein the crystal growth in the deposits are vertically oriented and the weldment and article are crack free.

EXAMPLE 2

The process of Example 1 is repeated except that the remelting process is carried out with a laser beam defocused to cover the 2 mm width of two deposited beads. For deposition the laser power was set at 1200 Watts with a speed of 25 IPM (64 cm/min) with a powder flow rate of 3.25 g/m. The remelt pass was carried out with a laser power of 1300 Watts and a travel speed of 10 IPM (25 cm/min). The deposition and remelting steps were repeated 6 times providing a build-up height of 3 mm.

Figure 4:
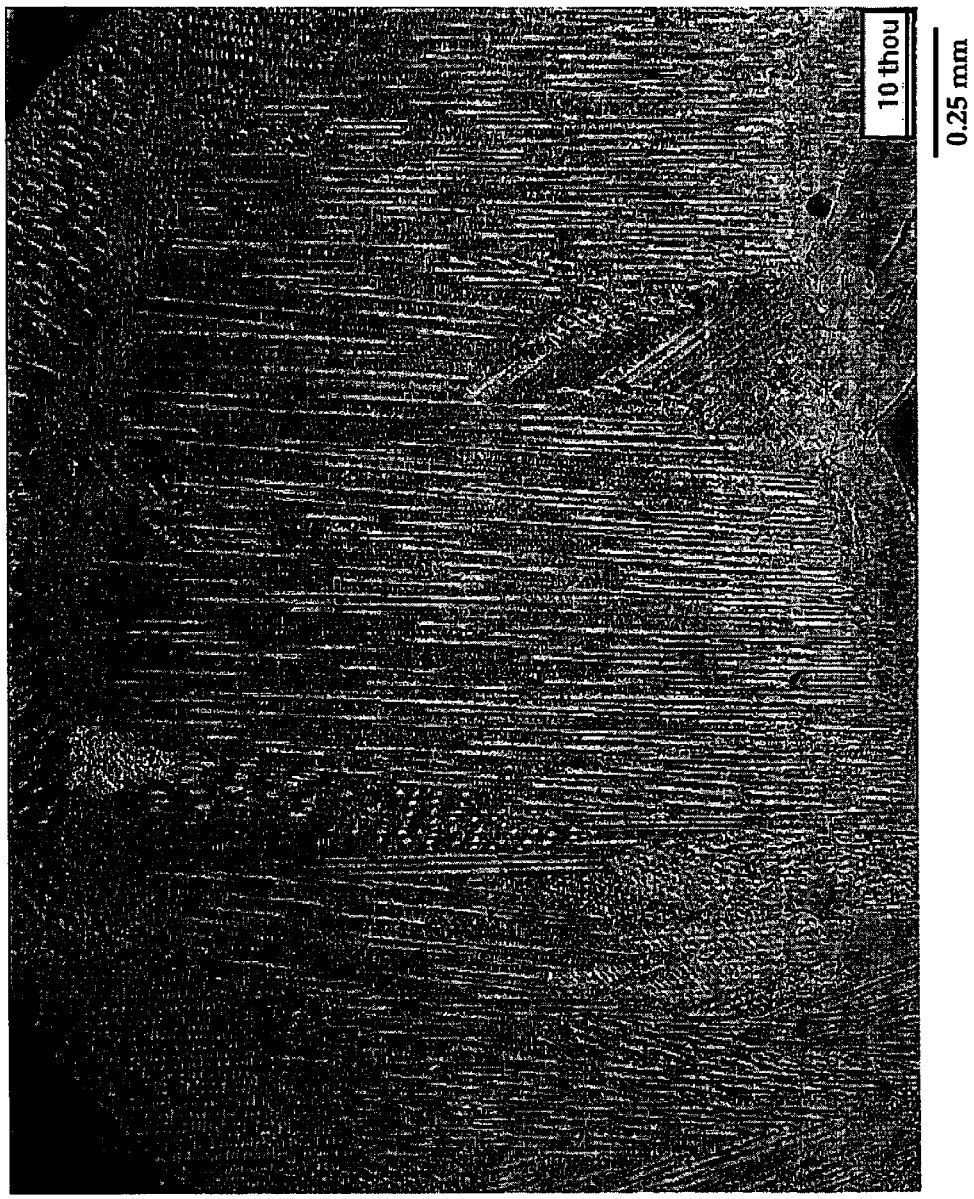
FIG. 4 is a photomicrograph (50X magnification) of a cross section of a laser powder welding deposit of multiple beads of filler alloy on a nickel based single crystal alloy with a remelting pass with a defocused laser covering multiple adjacent beads to align the crystal microstructure.

The weldment has a crystal structure as shown in the photomicrograph of FIG. 4 wherein the crystal grain in the deposits are vertically oriented and the weldment and article are crack free.

TABLE 1

Commonly used Ni based super alloy compositions.

| Alloy | Element | Ni | Cr | Co | Mo | W | Al | Ti | Ta | Re | Hf | C | B | Zr | Cb | Mn | Si | Fe |
|---|---|---|---|---|---|---|---|---|---|---|---|---|---|---|---|---|---|---|
| single | PWA 1480 | 62.5 | 10 | 5 | 0 | 4 | 5 | 1.5 | 12 | 0 | 0 | 0 | 0 | 0 | 0 | 0 | 0 | 0 |
| crystal | PWA 1484 | 59.4 | 5 | 10 | 2 | 6 | 5.6 |  | 9 | 3 | 0 | 0 | 0 | 0 | 0 | 0 | 0 | 0 |
| alloys | PWA 1483 | 53.2 | 12.8 | 9 | 1.9 | 3.9 | 3.6 | 4 | 4 | 0 | 0 | 0 | 0 | 0 | 0 | 0 | 0 | 0 |
|  | CMSX-2 | 66.6 | 8 | 4.6 | 0.6 | 7.9 | 5.6 | 0.9 | 5.8 | 0 | 0 | 0 | 0 | 0 | 0 | 0 | 0 | 0 |
|  | CMSX-4 | 61.8 | 6.5 | 9 | 0.6 | 6 | 5.6 | 1 | 6.5 | 3 | 0.1 | 0 | 0 | 0 | 0 | 0 | 0 | 0 |
|  | CMSX-6 | 70.4 | 10 | 5 | 3 | 0 | 4.8 | 4.7 | 2 | 0 | 0.1 | 0 | 0 | 0 | 0 | 0 | 0 | 0 |
|  | Rene-5 | 61.8 | 7 | 8 | 2 | 5 | 6.2 | 7 | 3 | 0 | 0.2 | 0 | 0 | 0 | 0 | 0 | 0 | 0 |
|  | SRR 99 | 66.5 | 8.5 | 5 | 0 | 9.5 | 5.5 | 2.2 | 2.8 | 0 | 0 | 0 | 0 | 0 | 0 | 0 | 0 | 0 |
| DS | PWA 1422 | 59 | 9 | 10 | 0 | 12.5 | 5 | 2 | 0 | 0 | 1.8 | 0.14 | 0.015 | 0.05 | 1 | 0 | 0 | 0 |
| alloys | PWA 1426 | 58.4 | 6.4 | 12.6 | 1.7 | 6.4 | 5.9 | 0 | 4 | 3 | 1.5 | 0 | 0.013 | 0.08 | 0 | 0 | 0 | 0 |
|  | GDT-111 (DS) | 58.4 | 16 | 9.5 | 1.5 | 3.8 | 3 | 4.9 | 0 | 0 | 0 | 0.1 | 0.001 | 0.001 | 0 | 0 | 0 | 0 |
| common | IN-625 | 61 | 21.5 | 0 | 9 | 0 | 0.2 | 0.2 | 0 | 0 | 0 | 0.05 | 0 | 0 | 3.6 | 0.2 | 0.2 | 2.5 |
| Ni weld | IN-718 | 52.5 | 19 | 0 | 3 | 0 | 0.5 | 0.9 | 0 | 0 | 0 | 0.04 | 0 | 0 |  | 0.2 | 0.2 | 18.5 |
| fillers | Hastelloy X | 47 | 22 | 1.5 | 9 | 0.6 | 0 | 0 | 0 | 0 | 0 | 0.1 | 0 | 0 | 0 | 0.5 | 0.5 | 18.5 |
|  | waspaloy | 58 | 19.5 | 13.5 | 4.3 | 0 | 1.3 | 3 | 0 | 0 | 0 | 0.08 | 0.006 | 0 | 0 | 0 | 0 | 0 |

What is claimed is:

1. A process for crack-free welding a nickel based single crystal superalloy article containing at least 5 weight % total of Al and Ti comprising:

(a) melting an article surface to be welded and a filler alloy with an energy source, wherein the filler alloy is a composition of a nickel based single crystal superalloy except that the total of Al and Ti is reduced to below 5 weight %;

(b) allowing the melted article surface and filler alloy to solidify to form a bead of deposit;

(c) providing a plurality of beads of adjacent deposits covering the article surface to be welded; and (d) remelting the adjacent beads of deposits with the energy source to provide vertically oriented crystal growth in the deposits.

2. Process of claim 1 wherein the energy source is a laser beam.

3. Process of claim 2 wherein laser is operated at a power density of about $10^4$ to $10^5$ watts/cm$^2$.

4. Process of claim 3 further comprising coating the welded article surface with an aluminide coating.

5. Process of claim 4 wherein the aluminum coating is applied to a thickness of up to about 10 mils.

6. Process of claim 1 wherein the process is carried out without preheating or separately heating the article.

7. Process of claim 6 wherein the process is carried out in an inert gas atmosphere at ambient temperature.

8. Process of claim 1 wherein the filler alloy does not contain any additional melting point depressants.

9. Process of claim 3 wherein in the filler alloy the total of Al and Ti is about 1.5 to 4.5 weight %.

10. Process of claim 1 wherein the filler alloy is comprised of the same elements in approximately the same proportions as in the article except for the reduced total of Al and Ti.

11. Process of claim 5 wherein in the filler alloy the total of Al and Ti is about 1.5 to 3.0 weight %.

12. Process of claim 1 wherein the steps (a) through (d) are repeated to form an additional layer of the deposit.

13. Process of claim 1 wherein the remelting uses a laser beam which is defocused to cover a plurality of the adjacent beads of deposit.

14. Process of claim 13 wherein the energy density of the laser for remelting is at about $10^4$ to $10^5$ watts/cm$^2$.

15. Process of claim 14 wherein the remelting penetrates at least 50% of the adjacent beads of deposits.

16. Process of claim 15 wherein the remelting is operated at a speed of about 5 to 25 IPM and a laser power of about 600 to 1400 watts.

17. Process of claim 1 wherein the laser beam melts the interface areas of the adjacent beads.

18. Process of claim 17 wherein the energy density of the laser for remelting is about $10^4$ to $10^5$ watts/cm$^2$.

19. Process of claim 18 wherein the remelting penetrates at least 50% of the adjacent beads of deposits.

20. Process of claim 19 wherein the remelting is operated at a speed of about 5 to 25 IPM and a laser power of about 600 to 1400 watts.

* * * * *